US012656670B2

(12) United States Patent
Kim et al.

(10) Patent No.: US 12,656,670 B2
(45) Date of Patent: Jun. 16, 2026

(54) DISPLAY SYSTEM AND METHOD FOR MAKING AND USING SAME

(71) Applicant: THE BOARD OF REGENTS FOR THE OKLAHOMA AGRICULTURAL AND MECHANICAL COLLEGES, Stillwater, OK (US)

(72) Inventors: Do Young Kim, Tulsa, OK (US); Gijun Seo, Tulsa, OK (US); Vishal Yeddu, Tulsa, OK (US)

(73) Assignee: The Board of Regents for the Oklahoma Agricultural and Mechanical Colleges, Stillwater, OK (US)

(*) Notice: Subject to any disclaimer, the term of this patent is extended or adjusted under 35 U.S.C. 154(b) by 675 days.

(21) Appl. No.: 17/736,478

(22) Filed: May 4, 2022

(65) Prior Publication Data

US 2022/0336767 A1    Oct. 20, 2022

Related U.S. Application Data

(63) Continuation of application No. PCT/US2020/059290, filed on Nov. 6, 2020.
(Continued)

(51) Int. Cl.
| | |
|---|---|
| *G03B 21/60* | (2014.01) |
| *H10K 50/15* | (2023.01) |
| *H10K 50/16* | (2023.01) |
| *H10K 50/17* | (2023.01) |
| *H10K 77/10* | (2023.01) |
| *H10K 50/18* | (2023.01) |

(Continued)

(52) U.S. Cl.
CPC ............. *G03B 21/60* (2013.01); *H10K 50/15* (2023.02); *H10K 50/16* (2023.02); *H10K 50/171* (2023.02); *H10K 77/111* (2023.02); *H10K 50/18* (2023.02); *H10K 50/828* (2023.02); *H10K 2102/103* (2023.02)

(58) Field of Classification Search
None
See application file for complete search history.

(56) References Cited

U.S. PATENT DOCUMENTS

| | | | |
|---|---|---|---|
| 9,978,472 | B2 | 5/2018 | Kim et al. |
| 9,997,571 | B2 | 6/2018 | So et al. |

(Continued)

OTHER PUBLICATIONS

USPTO acting as the International Searching Authority; International Search Report and Written Opinion regarding PCT/US2020/059290, dated Mar. 10, 2021.
(Continued)

*Primary Examiner* — Jack S Chen
(74) *Attorney, Agent, or Firm* — DUNLAP CODDING, P.C.

(57) ABSTRACT

Methods, a display system and projection screen are described. The projection screen includes a substrate supporting a plurality of pixels. Each pixel has a sensitizing part communicating with at least one light source, the sensitizing part being configured to detect a presence of a non-visible medium indicative of a part of an image, and to activate the at least one light source to emit light. The pixels having a first electrode and a second electrode configured to supply electricity to the sensitizing part and the light source.

20 Claims, 7 Drawing Sheets

Related U.S. Application Data

(60) Provisional application No. 62/932,846, filed on Nov. 8, 2019.

(51) Int. Cl.
| | |
|---|---|
| *H10K 50/828* | (2023.01) |
| *H10K 102/10* | (2023.01) |

(56) References Cited

U.S. PATENT DOCUMENTS

| | | | |
|---|---|---|---|
| 10,134,815 B2 | 11/2018 | So et al. | |
| 2010/0277696 A1 | 11/2010 | Huebner | |
| 2011/0279739 A1 | 11/2011 | Nairn et al. | |
| 2013/0229527 A1 | 9/2013 | Reichow et al. | |
| 2022/0336767 A1* | 10/2022 | Kim | H10K 50/171 |

OTHER PUBLICATIONS

Yeddu, Vishal, Low-Bandgap Polymer-based Infrared-to-Visible Up-Conversion Organic Light-Emitting Diodes with Infrared Sensitivity up to 1.1um, ACS Photonics 2019, 6, 10, 2368?2374; [online] https://pubs.acs.org/doi/abs/10.1021/acsphotonics.9b00669.

McArthey, M A et al., Low Voltage Low-Power Organic Light-Emitting Transistors for Active Matrix Displays, Science, vol. 332, Apr. 29, 2011.

Yeddu, Vishal, Low-Band-Gap Polymer-Based Infrared-to-Visible Upconversion Organic Light-Emitting Diodes with Infrared Sensitivity up to 1.1 µm, ACS Photonics, May 6, 2019.

Yu, Hyeonggeun, Vertical Organic Field-Effect Transistors for Integrated Optoelectronic Applications, American Chemical Society, 2016/04/27, 8,16, 1944-8244, 2016/04/27.

Lee, Jae Woong, Unraveling the Gain Mechanism in High Performance Solution-Processed PbS Infrared PIN Photodiodes, Adv. Funct. Mater., 25, 1233., 2015.

Kim, Do Young, Organic Infrared Upconversion Device, Adv. Mater, 22, 2260 Featured on MaterialsViews.com., 2010.

Kim, Do Young, PbSe Nanocrystal-Based Infrared-to-Visible Up-Conversion Device, Nano Lett., 11, 2109, 2011.

Kim, Do Young, Multi-spectral imaging with infrared sensitive organic light emitting diode, Scientific Reports, 4, 5946, 2014.

Lee et al., "Inorganic UV-Visible-SWIR Broadband Photodetector Based on Monodisperse PbS Nanocrystals", www.small-journal.com, No. 10, pp. 1328-1333, DOI: 10.1002/smll.201503244, 2016.

Lee et al., Supporting Information for "Inorganic UV-Visible-SWIR Broadband Photodetector Based on Monodisperse PbS Nanocrystals" DOI: 10.1002/smll.201503244, Wiley-VCH Verlag GmbH & Co., KGaA, 69469 Weinheim, Germany, 2016.

\* cited by examiner

DISPLAY SYSTEM AND METHOD FOR MAKING AND USING SAME

This application is a non-provisional application claiming benefit to the international application no. PCT/US20/59290 filed on Nov. 6, 2020, which claims priority to U.S. Provisional Application Ser. No. 62/932,846, filed on Nov. 8, 2019, the entirety of which is hereby expressly incorporated herein by reference.

BACKGROUND

Television screen sizes are getting bigger and bigger every year. However, manufacturers using organic light-emitting diode (OLED) technology face a big challenge in fabricating TV screens over 100 inches at reasonable cost.

Unlike the OLED process which is compatible with low-cost, low-temperature, and large area processing methods including roll-to-roll printing processes, the thin film transistor (TFT) backplane used for active matrix (AM) driving requires a batch-to-batch vacuum process with a limited substrate size. Currently, the largest mother-glass size for a TFT backplane process is Gen 10 (3 m×3 m), from which there is currently no way to make multiple 100-inch television screens at a time, thus resulting in a tremendously expensive television price (greater than $50,000 for a Sony 100-inch television). Therefore, providing a solution for fabricating an extremely large-screen television at a significantly lower cost will be very attractive to display panel manufacturers.

On the other hand, projection displays have been used as the alternative solution for extremely large screens (>100 inch) until now. However, it is very difficult to achieve excellent quality projected image because the projection screen reflects not only the projected images, but also ambient light in the room. This detracts from the image quality, leading to sub-optimal viewing experience, including restricting the use location to a completely dark room, such as a movie theater. In addition, the conventional projection screen is typically white to maximize the reflection of all visible lights, thus resulting in a very poor contrast ratio. A screen which is black in the off-state, like typical flat panel screen televisions, is more optimal for achieving a high contrast ratio. In spite of the terrible display image quality, projection displays are still used extensively in company meeting rooms, school classrooms, and churches, because there is currently no alternative technology enabling equivalently large screens; i.e., screens greater than or equal to 100 inches.

To this end, a large screen that overcomes the issues described above would be desirable. It is to such an improved screen that the present disclosure is directed.

DETAILED DESCRIPTION

Figure 1:
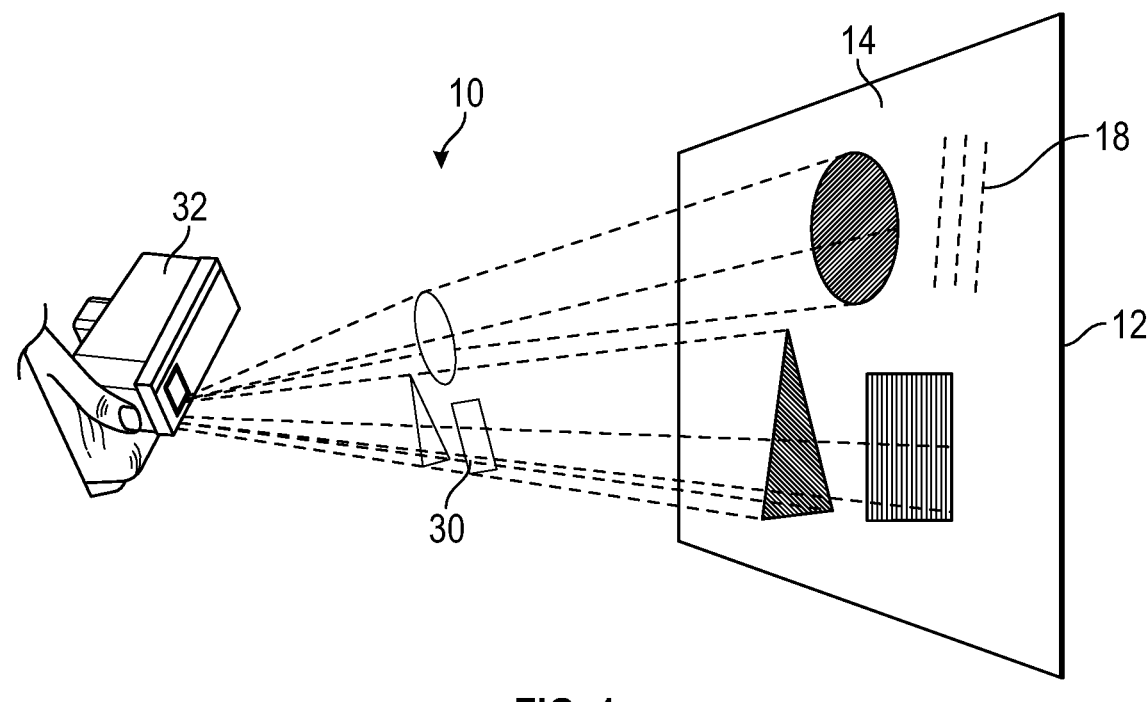
FIG. 1 is a diagrammatic perspective view of an exemplary embodiment of a display system in accordance with the present disclosure.

The following detailed description refers to the accompanying drawings. The same reference numbers in different drawings may identify the same or similar elements.

The mechanisms proposed in this disclosure circumvent the problems described above. The present disclosure describes a system and method which fabricate a thin film transistor-less organic light-emitting diode-based projection display system.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more and the singular also includes the plural unless it is obvious that it is meant otherwise.

Further, use of the term "plurality" is meant to convey "more than one" unless expressly stated to the contrary.

As used herein, qualifiers like "substantially," "about," "approximately," and combinations and variations thereof, are intended to include not only the exact amount or value that they qualify, but also some slight deviations therefrom, which may be due to manufacturing tolerances, measurement error, wear and tear, stresses exerted on various parts, and combinations thereof, for example.

The use of the term "at least one" or "one or more" will be understood to include one as well as any quantity more than one. In addition, the use of the phrase "at least one of X, V, and Z" will be understood to include X alone, V alone, and Z alone, as well as any combination of X, V, and Z.

The use of ordinal number terminology (i.e., "first", "second", "third", "fourth", etc.) is solely for the purpose of differentiating between two or more items and, unless explicitly stated otherwise, is not meant to imply any sequence or order or importance to one item over another or any order of addition.

The term "image", as used herein, means two-dimensional or three-dimensional visual representation of something: such as (1): a likeness of an object produced on a photographic material (2): a picture produced on an electronic display (such as a television or computer screen); or (3) data that can be perceived either directly or with the aid of a machine or a device.

The term "moving image", as used herein, means a series of related images which, when shown in succession, impart an impression of motion.

As used herein, all numerical values or ranges (e.g., in units of length such as micrometers or millimeters) include fractions of the values and integers within such ranges and fractions of the integers within such ranges unless the context clearly indicates otherwise. Thus, to illustrate, reference to a numerical range, such as 1-10 includes 1, 2, 3, 4, 5, 6, 7, 8, 9, 10, as well as 1.1, 1.2, 1.3, 1.4, 1.5, etc., and so forth. Reference to a range of 1-50 therefore includes 1, 2, 3, 4, 5, 6, 7, 8, 9, 10, 11, 12, 13, 14, 15, 16, 17, 18, 19, 20, etc., up to and including 50, as well as 1.1, 1.2, 1.3, 1.4, 1.5, etc., 2.1, 2.2, 2.3, 2.4, 2.5, etc., and so forth. Reference to a series of ranges includes ranges which combine the values of the boundaries of different ranges within the series. Thus, to illustrate reference to a series of ranges, for example, of 1-10, 10-20, 20-30, 30-40, 40-50, 50-60, 60-75, 75-100, 100-150, 150-200, 200-250, 250-300, 300-400, 400-500, 500-750, 750-1,000, includes ranges of 1-20, 10-50, 50-100, 100-500, and 500-1,000, for example.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

In accordance with embodiments of the present disclosure, the system and method which fabricate a thin film transistor-less organic light-emitting diode-based projection display system, allows for a substantial (greater than or equal to 100 inches), high quality, projection screen based on OLED technology.

Figure 2A:
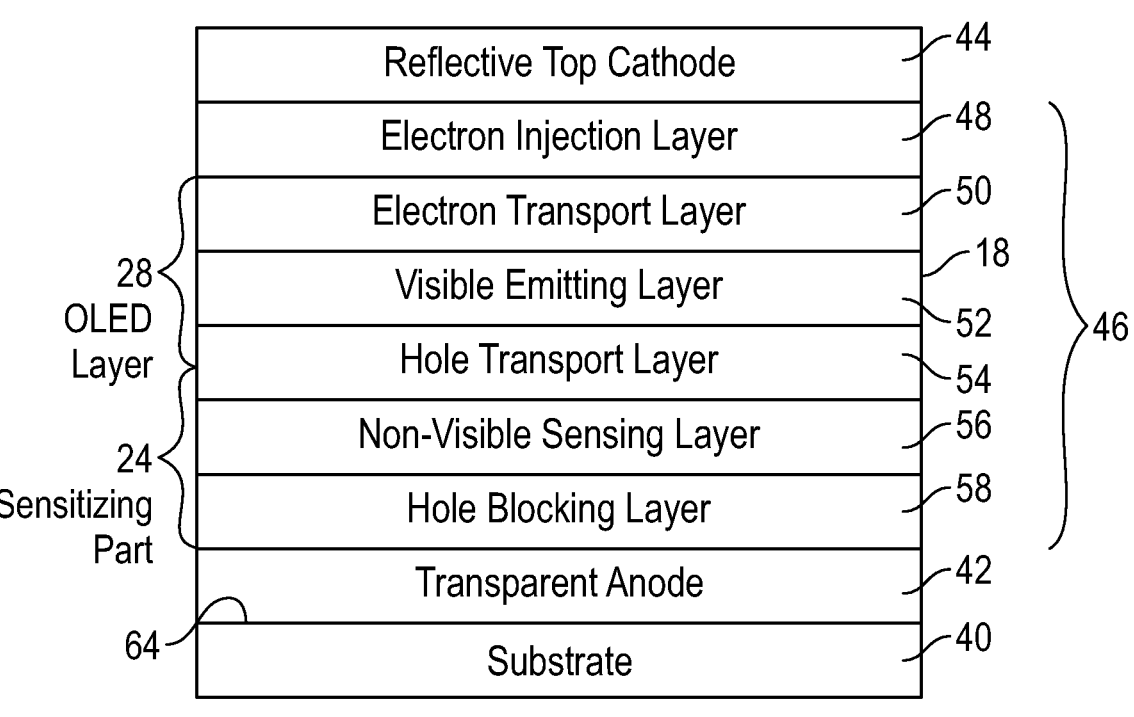
FIG. 2A-C are schematic, cross-sectional views of exemplary pixels of a projection screen of the display system of FIG. 1 in accordance with the present disclosure.
Figure 2B:
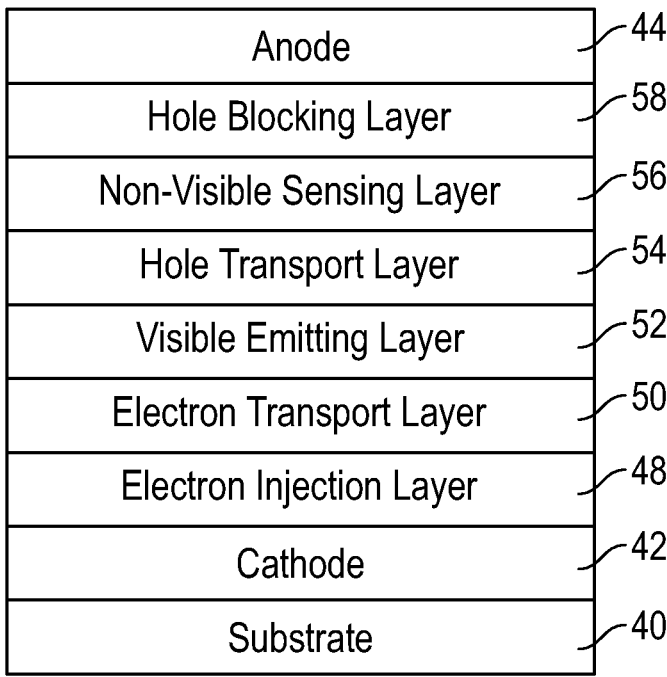
Figure 2C:
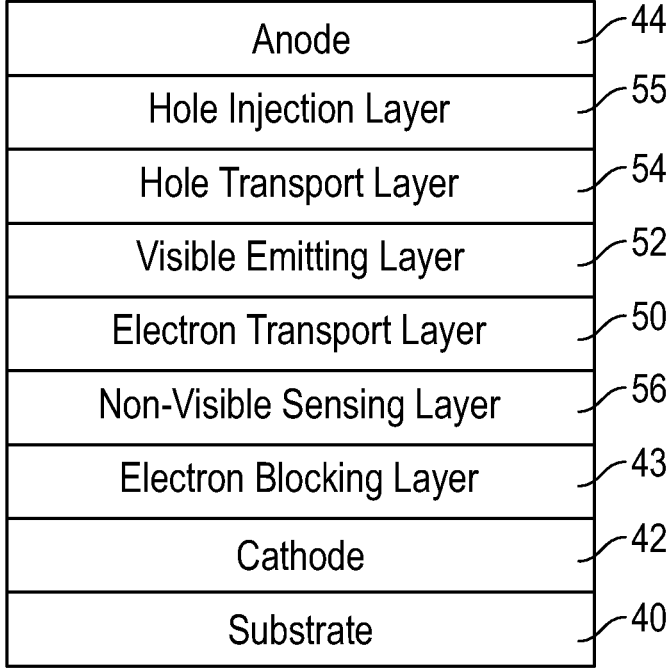

As discussed above, the majority of the aforementioned prior art devices either include the use of thin film transistor backplane for active matrix driving, which require a batch-to-batch vacuum process and as such, limit the substrate size; low quality projection screens, which reflect not only the projected images, but also ambient visible light in the room; or a high cost screen alternative. As shown in FIG. 1, the present disclosure addresses these deficiencies with a system and method for fabricating a large, high quality, display system 10 comprising a projection screen 12 that may be devoid of a TFT backplane. The projection screen 12 has a display surface 14 and a plurality of pixels 18 adjacent to the display surface. As shown in FIGS. 2A-C, the plurality of pixels 18 have a sensitizing part 24 communicating with at least one light source 28. The light source 28 will be described herein by way of example as an Organic Light Emitting Diode (OLED) 28 or an OLED layer 28. It should be understood, however, that the light source 28 can be implemented in other manners, such as Quantum dot light-emitting diode (QD-LED); perovskite light-emitting diode (P-LED); or a group III-V compound semiconductor light-emitting diode (LED). Any other type of LED can be used and may be able to make the same or similar results with the same, similar, or very different device structures.

The sensitizing part 24 is configured to detect a presence of a non-visible medium 30 (see FIG. 1) e.g., infrared light indicative of a part of an image, and to activate the at least one light source 28 to emit light. By distributing the plurality of pixels 18 across the display surface 14, the plurality of pixels 18 receive distinct portions of the non-visible medium 30, and thereby cooperate to project images through the display surface 14 of the projection screen 12.

Referring now to the drawings, FIG. 1 illustrates a diagrammatic perspective view of an exemplary embodiment of the display system 10 constructed in accordance with the present disclosure. The display system 10 of FIG. 1, includes a projector 32 and self-emitting projection screen 12, hereinafter referred to as a "projection screen." Although the display system 10 will be described hereinafter by way of example as using infrared light as the non-visible medium 30, it should be understood that another non-visible medium 30 could be used, such as ultraviolet light. The projection screen 12 is provided with the plurality of pixels 18 and each pixel of the plurality of pixels 18 is provided with at least one sensitizing part 24 and the light source 28 as described below. The plurality of pixels 18 may be arranged in a grid format having a desired resolution. The plurality of pixels 18 may be configured to receive non-visible light and to convert the non-visible light into emitted visible light as discussed below.

In some embodiments, the projector 32 may use invisible infrared light (non-visible medium 30) instead of visible light for delivering an image or a plurality of moving images to the display surface 14 of the projection screen 12. The infrared light may pass through the display surface 14 of the projection screen 12 and is received by the sensitizing part 24 of the plurality of pixels 18 within the projection screen 12. The infrared light stimulates the sensitizing part 24. Upon stimulation of the sensitizing part 24 of the projection screen 12, the sensitizing part 24 supplies charge carriers (or currents) into the light source 28 to cause the light source 28 to emit visible light indicative of the part of the image that stimulated the sensitizing part 24. For purposes of clarity, the following description will describe the projection screen 12 emitting the image. But such description is equally applicable to the projection screen 12 emitting successive images to form moving images. The infrared projector 32 delivers an image onto the display surface 14 of the projection screen 12 in infrared light, for example, and such infrared light triggers the sensitizing part 24 to enable the light source 28 (which is described herein by way of example as an OLED) to emit visible light indicative of a part of the image. Thus, the plurality of pixels 18 within the projection screen 12 are adapted to convert the image in non-visible form into the image in visible form.

FIGS. 2A-C illustrate exemplary pixels of the plurality of pixels 18 of the projection screen 12 of the display system 10 constructed in accordance with the present disclosure. The projection screen 12 is desirable in a flexible state so that the projection screen 12 can be connected to a rolling carrier (such as a spring-loaded bar) supported by a housing. The projection screen 12 can be positioned through a slot in the housing and extended out of the housing to be placed in a viewing position, or retracted into the housing into a storage position. The projection screen 12 will have the plurality of pixels 18. The exemplary pixel of the plurality of pixels 18 has a substrate 40, a first electrode 42 positioned on the substrate 40, a second electrode 44 positioned away from the substrate 40, but supported by the substrate 40, and a plurality of semiconducting organic thin film layers 46 forming the sensitizing part 24 and the light source 28. Some of the semiconducting organic thin film layers 46 form the sensitizing part 24, and other ones of the semiconducting organic thin film layers 46 form the light source 28, which is described herein by way of example as an OLED. The semiconducting organic thin film layers 46 may include an electron injection layer 48, an electron transport layer 50, a visible emitting layer 52, a hole transport layer 54, a non-visible sensing layer 56, and a hole blocking layer 58.

The semiconducting organic thin film layers 46 of the projection screen 12 are positioned between the first electrode 42 and the second electrode 44. The first and second electrodes 42 and 44 are constructed of an electrically conductive material. The thickness of the one or more semiconducting organic thin films 46 may be between 1-200 nm. The first electrode 42 may be used as an anode or a cathode and the second electrode 44 may be used as a cathode or an anode. In the example described herein, the first electrode 42 is an anode, and the second electrode 44 is a cathode. It should be understood, as shown in FIG. 2B, that when the first electrode 42 is a cathode and the second electrode 44 is an anode, the structure is changed to have the following sequence of layers substrate 40/first electrode 42 being the cathode/electron injection layer 48/electron transport layer 50/visible emitting layer 52/hole transport layer 54/non-visible sensing layer 56/hole blocking layer 58/second electrode 44 being the anode. In another embodiment, as shown in FIG. 2C, the structure may be changed to have the substrate 40/first electrode 42 being the cathode/electron blocking layer 43/non-visible sensing layer 56/electron transport layer 50/visible emitting layer 52/hole transport layer 54/hole injection layer 55/the second electrode 44 being the anode. The anode is a positively charged electrode by which electrons leave the projection screen. The cathode is a negatively charged electrode by which electrons enter the projection screen. In one embodiment, the first electrode 42 may be a transparent anode, and the second electrode 44 may be a reflective top cathode. Also, the first electrode 42 may be a reflective bottom anode, and the second electrode 44 may be a transparent top cathode. The substrate 40 and the first electrode 42 may both be transparent to visible light, and may also be transparent to the non-visible medium used to stimulate the sensitizing part 24. The electron injection layer 48, the electron transport layer 50, the visible emitting layer 52, and the hole transport layer 54 form the OLED of the light source 28. The sensitizing part 24 is formed by the hole transport layer 54, the non-visible sensing layer 56 and the hole blocking layer 58.

In use, a voltage is placed across the first electrode 42 and the second electrode 44. The voltage should be at a level that is insufficient to cause the visible emitting layer 52 to emit light without the non-visible medium 30 being supplied to the sensitizing part 24. The voltage applies a forward bias to the OLED 28, without independently causing the light source 28 to emit light.

To keep the light source 28 from emitting light, i.e., "off" under forward bias, the hole blocking layer (HBL) 58 located between the non-visible sensing layer 56 and the first electrode 42 blocks hole injection from the first electrode 42. When the non-visible medium 30, such as infrared light, is applied to the non-visible sensing layer 56 through the substrate 40, the first electrode 42 and the hole blocking layer 58, the non-visible sensing layer 56 generates photo-generated holes that are injected through the hole transport layer (HTL) 54 into the visible emitting layer 52 (e.g., the red, green, or blue emitter 102a, 102b, or 102c) of the light source 28. The holes recombine with electrons injected through the electron injection layer 48 from the second electrode 44 and cause the visible emitting layer 52 to emit visible light, such as red, green, or blue light, respectively. The second electrode 44 is constructed of a material that is opaque to and reflects visible light thereby directing the visible light generated by the visible emitting layer 52 towards the substrate 40.

Thus, the sensitizing part 24 prevents a sufficient amount of holes supplied by the first electrode 42 from reaching the visible emitting layer 52 of the light source 28 to independently generate light, and supplies photo-generated holes to the visible emitting layer 52 via the hole transport layer 54 in the presence of the non-visible medium 30 thereby enabling the light source 28 to emit visible light.

Figure 3A:
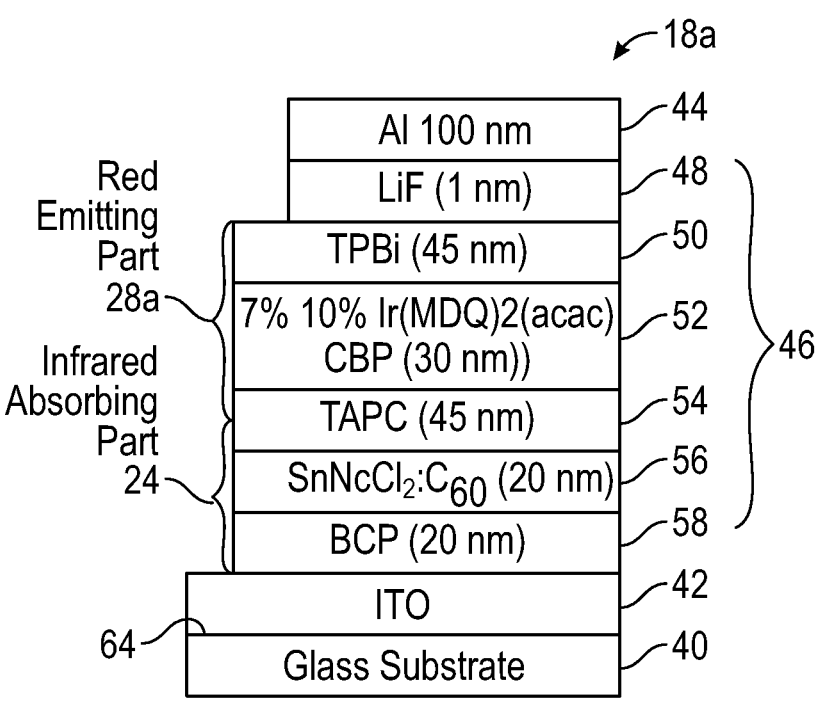
FIG. 3A-3C are schematic, cross-sectional views of exemplary red, green, blue sub-pixels of the projection screen of the display system of FIG. 1 in accordance with the present disclosure.
Figure 3B:
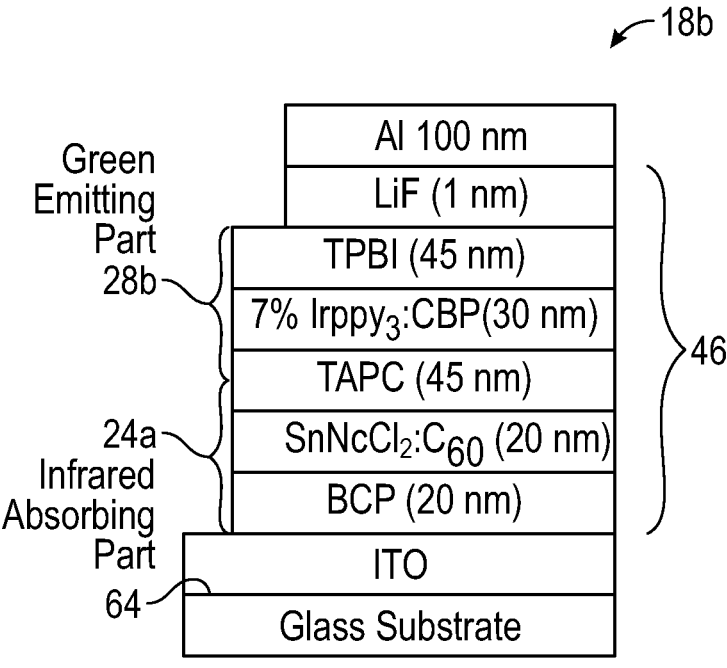
Figure 3C:
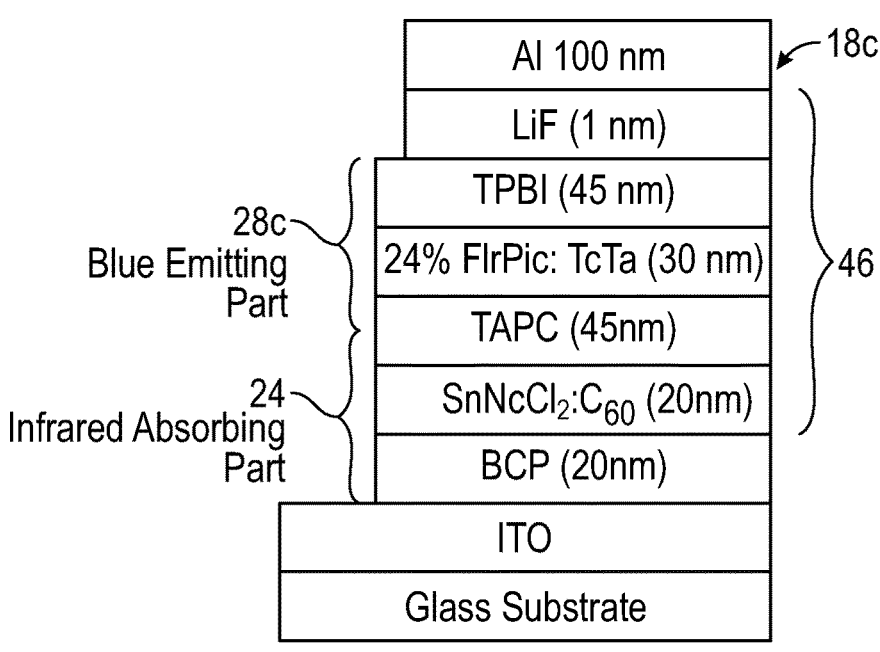

Shown in FIGS. 3A, 3B, and 3C are exemplary red, green, blue sub-pixels 18a, 18b, and 18c having infrared-sensitive red, green, and blue emitting light sources 28a, 28b, and 28c (e.g., OLEDs) integrated with an infrared organic photodetector (non-visible sensing layer 56). The sub-pixels 18a, 18b, and 18c having the infrared-sensitive red, green, and blue emitting light sources 28a, 28b, and 28c have a similar structure compared with the exemplary pixel of the plurality of pixels 18 depicted in FIG. 2. The non-visible sensing layer 56 can be considered to be an infrared organic photodetector in some embodiments. Without infrared irradiation being received by the infrared organic photodetector, red, green, and blue emissions from the red, green, and blue light sources 28a, 28b, and 28c are not observed until the voltage reaches a first voltage which may be in a range from about 12V to 14 V. Upon irradiation with invisible infrared light, the light sources 28a, 28b, and 28c turn on and emit light at a second voltage which may be in a range from about 2V to 3V. By placing the voltage between the first electrode 42 and the second electrode 44 at a level between 3 V to 12 V, the light sources 28a, 28b, and 28c will be forwarded biased, but will not emit light without the presence of the non-visible medium 30 being applied to the non-visible sensing layer 56.

The semiconducting organic thin film layers 46, the first electrode 42, and the second electrode 44 may be deposited onto the substrate 40 using any suitable process. The substrate 40 may be optically transparent to light in the visible spectrum and also optically transparent to the non-visible medium 30. The substrate 40 may be comprised of glass, polycarbonate, acrylic, polypropylene, polystyrene, a polymer substrate such as polyvinyl chloride or similar substrate or the like, a flexible substrate such as polyimide or Polyethylene terephthalate, plastic, sapphire, paper, clothes, fabric, metal foil, or other materials known to those of ordinary skill in the art. In one embodiment, the substrate 40 may be constructed of a flexible material that can be rolled without damaging the substrate 40. In some embodiments, the substrate 40 may be constructed of a rigid material that cannot be rolled and unrolled without breaking. The substrate 40 can be 0.4-1.1 mm thick. In another embodiment, the use of a thinner substrate 40 may be approximately 20-300 μm.

The first electrode 42 may be deposited onto the substrate 40. The first electrode 42 is also transparent to light in the visible spectrum and the non-visible medium 30. The first electrode 42 may be an indium tin oxide (ITO), an indium-zinc-oxide (IZO), zinc-oxide, tin-oxide, a Carbon Nanotube, a silver nanowire, a poly(3,4-ethylenedioxythiophene) polystyrene sulfonate (PEDOT:PSS), or other material known to those of ordinary skill in the art configured to be electrically conductive, and transparent to light in the visible region, and transparent to the non-visible medium 30. In one embodiment, the first electrode 42 is constructed of indium tin oxide having a thickness within a range of about 40-400 nm. In one embodiment, the indium tin oxide is less than or equal to 150 nm thick. The resistivity of the ITO may be less than or equal to about $4 \times 10^{-4}$ Ωcm.

The first electrode 42, the semiconducting organic thin film layers 46, and the second electrode 44 may be deposited using a sputtering tool, such as a radio frequency magnetron sputtering tool. All other layers except an ITO or an IZO bottom electrode are typically deposited by vacuum thermal evaporation process, or can also be deposited by solution-based processes such as a spin coating, an inkjet printing, a slot-die coating, and a spray coating. To make the projection screen 12, the substrate 40 is selected. The substrate 40 has a deposition surface 64 that may be relatively smooth to reduce the presence of electric fields, which may lead to shorts. In one embodiment, the root mean square (RMS) roughness of the deposition surface 64 may be less than about 2 nm to reduce the possibility of shorts caused by strong electric fields.

Deposition parameters, such as temperature, pressure, process gas mixture, and deposition rate, are controlled such that the resistivity of the first electrode 42, for example, is achieved with a high carrier concentration. In one embodiment, the first electrode 42 may be comprised of ITO. The charge carrier concentration of ITO as the first electrode 42 may be at least about $7 \times 10^{20}$ cm$^{-3}$. Preferably, the first electrode 42 has as high a charge carrier concentration as possible. The high carrier concentration enhances hole-injection, leading to an increase in electroluminescent efficiency. The first electrode 42 may be sputtered using an oxidized target. The oxidized target may be comprised of In$_2$O$_3$ and SnO$_2$, or other compositions known to those of skill in the art. In one embodiment, the weight proportion of the In$_2$O$_3$ and SnO$_2$ is approximately 9:1. The deposition parameters of the sputtering process include a substrate temperature between 300-400° C., a processing pressure between $10^{-3}$-$10^{-5}$ Torr, a processing gas mixture of Ar and Hz, and a deposition rate of approximately 1-10 nm/min. In one embodiment, the deposition rate may be 1-2 nm/min. In one embodiment, the first electrode 42 has an optical transmittance in the visible wavelength range of over 85% and less than 100%. The work function of the first electrode 42 (e.g., the transparent anode) should closely match the ionization potential of the subsequently formed organic functional layers. In one embodiment, the first electrode 42 comprises a work function of about 4.8-5.2 eV. The substrate 40 can be sized to extend over and form the display surface 14 of the projection screen 12. Many pixels of the plurality of pixels 18 and/or the sub-pixels 18a, 18b, 18c can be formed on the substrate to form a desired resolution for the projection screen 12. The first electrode 42 may substantially cover the display surface 14 of the projection screen 12. As the semiconducting organic film layers 46 are deposited on the first electrode 42 to form the plurality of pixels 18 and/or the sub-pixels 18a, 18b, or 18c, an etching process, such as photolithography (using a positive mask, a negative mask or combinations thereof), can be used to separate and form the deposited layers into the individual pixel of the plurality of pixels 18 and/or the sub-pixels 18a, 18b, or 18c. One of the first electrode 42 or the second electrode 44 is divided into the same color sub-pixels 18a, 18b, 18c. For example, one of the first electrode 42 or the second electrode 44 can be divided into three areas: red sub-pixel areas, green sub-pixel areas, and blue sub-pixel areas. On the other hands, all other layers including the hole blocking layer 58, the non-visible sensing layer 56, the hole transport layer 54, the electron transport layer 50, the electron injection layer 48, and the other one of the first electrode 42 or the second electrode 44 do not need to be pixelized and can cover the entire display surface 14 of the projection screen 12 except the visible emitting layer 52. If the visible emitting layer 52 composes of red, green, and blue emitters 102a, 102b, and 102c, the visible emitting layer 52 should be divided into three areas. However, if the visible emitting layer 52 is a white emitter, the visible emitting layer 52 also does not need to be pixelized and can cover the entire display surface 14 of the projection screen 12.

The hole blocking layer 58 is deposited onto and covers the first electrode 42. The hole blocking layer 58 may be comprised of a ZnO, a TiO, a BCP, a Bphen, a 3TPYMB, a TPBi, a TMPYPB, a PC60BM, a PC70BM, an ITIC, or other materials known to those of ordinary skill in the art.

The non-visible sensing layer 56 is deposited onto and covers the hole blocking layer 58. The non-visible sensing layer 56 may be comprised of a SnPc, a SnPc:C60, a SnNcCl2, a PbS nanocrystal layer, a PbSe nanocrystal layer, an InAs nanocrystal layer, or other materials known to those of ordinary skill in the art.

The hole transport layer 54 is deposited onto the non-visible sensing layer 56. The hole transport layer 54 may be comprised of a TAPC, a NPB, a TFB, a TPD, a poly-TPD, a TFB, a P3HT, or other materials known to those of ordinary skill in the art.

The visible emitting layer 52 is deposited onto and covers the hole transport layer 54. The visible emitting layer 52 may be comprised of Ir(ppy)3, FlrPic, Ir(MDQ)2(acac) CBP, MEH-PPV, Alq3, or other materials known to those of ordinary skill in the art.

The electron transport layer 50 is deposited onto and covers the visible emitting layer 52. The electron transport layer 50 may be comprised of BCP, a Bphen, a 3TPYMB, a TPBi, a TMPYPB, an Alq3, or other materials known to those of ordinary skill in the art.

The electron injection layer 48 is deposited onto and covers the electron transport layer 50. The electron injection layer 48 may be comprised of LiF, a Liq, or other materials known to those of ordinary skill in the art.

The second electrode 44 is deposited onto the electron injection layer 48. The second electrode 44 may be comprised of Al, Ag, or other materials known to those of ordinary skill in the art. The second electrode 44 may extend over substantially the entire display surface such that the second electrode 44 contacts and is positioned to supply electrons to the plurality of pixels 18 and/or the sub-pixels 18a, 18b, or 18c of the projection screen 12. In other embodiments, the second electrode 44 is patterned to correspond to a particular pixel of the plurality of pixels 18 or sub-arrays of the sub-pixels 18a, 18b, or 18c.

FIGS. 3A-3C illustrates schematic, cross-sectional views of particular examples of the sub-pixels 18a, 18b, and/or 18c of a monochrome projection screen 12 in accordance with the present disclosure. FIG. 3A shows the red sub-pixel 18a having a red light source 28a in the form on a red OLED; FIG. 3B shows the green sub-pixel 18b having a green light source 28b in the form on a green OLED, and FIG. 3C shows the blue sub-pixel 18c having a blue light source 28c in the form of a blue OLED. In each of these examples, the sub-pixel 18a, 18b, or 18c is monochrome, and only provides a single color.

FIG. 3A illustrates a schematic, cross sectional view of the red sub-pixel 18a having the red light source 28a. The red sub-pixel 18a has an infrared sensitizing part 24a and the red light source 28a. The infrared sensitizing part 24a and the red light source 28a are positioned between the electron injection layer 48 and the first electrode 42. The first electrode 42 is deposited onto the substrate 40. The first electrode 42 is comprised of an Indium Tin Oxide (ITO). The infrared sensitizing part 24a includes the hole blocking layer 58, the non-visible sensing layer 56, and the hole transport layer 54. The hole blocking layer 58 is deposited onto the first electrode 42. The hole blocking layer 58 is comprised of BCP. The hole blocking layer 58 may have a thickness of 20 nm. The non-visible sensing layer 56 is deposited onto the hole blocking layer 58. The non-visible sensing layer 56 can be comprised of SnNcCl2:C60 that is an infrared sensor that converts infrared light into holes. The non-visible sensing layer 56 may have a thickness of 20 nm. The hole transport layer 54 is deposited onto the non-visible sensing layer 56. The hole transport layer 54 is comprised of TAPC. The hole transport layer 54 may have a thickness of approximately 45 nm. The red light source 28a includes the hole transport layer 54, the visible emitting layer 52, and the electron transport layer 50. The visible emitting layer 52 is deposited onto the hole transport layer 54. In this example, the visible emitting layer 52 is comprised of 7% 10% Ir(MDQ)2(acac) CBP. The visible emitting layer 52 may have a thickness of approximately 30 nm. The electron transport layer 50 is deposited onto the visible emitting layer 52. The electron transport layer 50 is comprised of TPBi. The electron transport layer 50 may have a thickness of approximately 45 nm. The electron injection layer 48 is deposited onto the electron transport layer 50. In this example, the electron injection layer 48 is comprised of LiF. The electron injection layer 48 may have a thickness of 1 nm. The second electrode 44 is deposited onto the electron injection layer 48. The second electrode 44 is comprised of Al. The second electrode 44 may have a thickness of 100 nm.

FIG. 3B illustrates a schematic, cross sectional view of the green sub-pixel 18b having the green light source 28b. The green sub-pixel 18b depicted in FIG. 3B is identical in construction and function as the red sub-pixel 18a depicted in FIG. 3A, with the exception that the visible emitting layer 52, in this example, is comprised of 7% Irppy$_3$:CBP.

FIG. 3C illustrates a schematic, cross sectional view of the blue sub-pixel 18c having the blue light source 28c. The blue sub-pixel 18c of FIG. 3C is identical in construction and function as the red sub-pixel 18a of FIG. 3A, with the exception that the visible emitting layer 52, in this example, is comprised of 24% FlrPic:TcTa.

Figure 4:
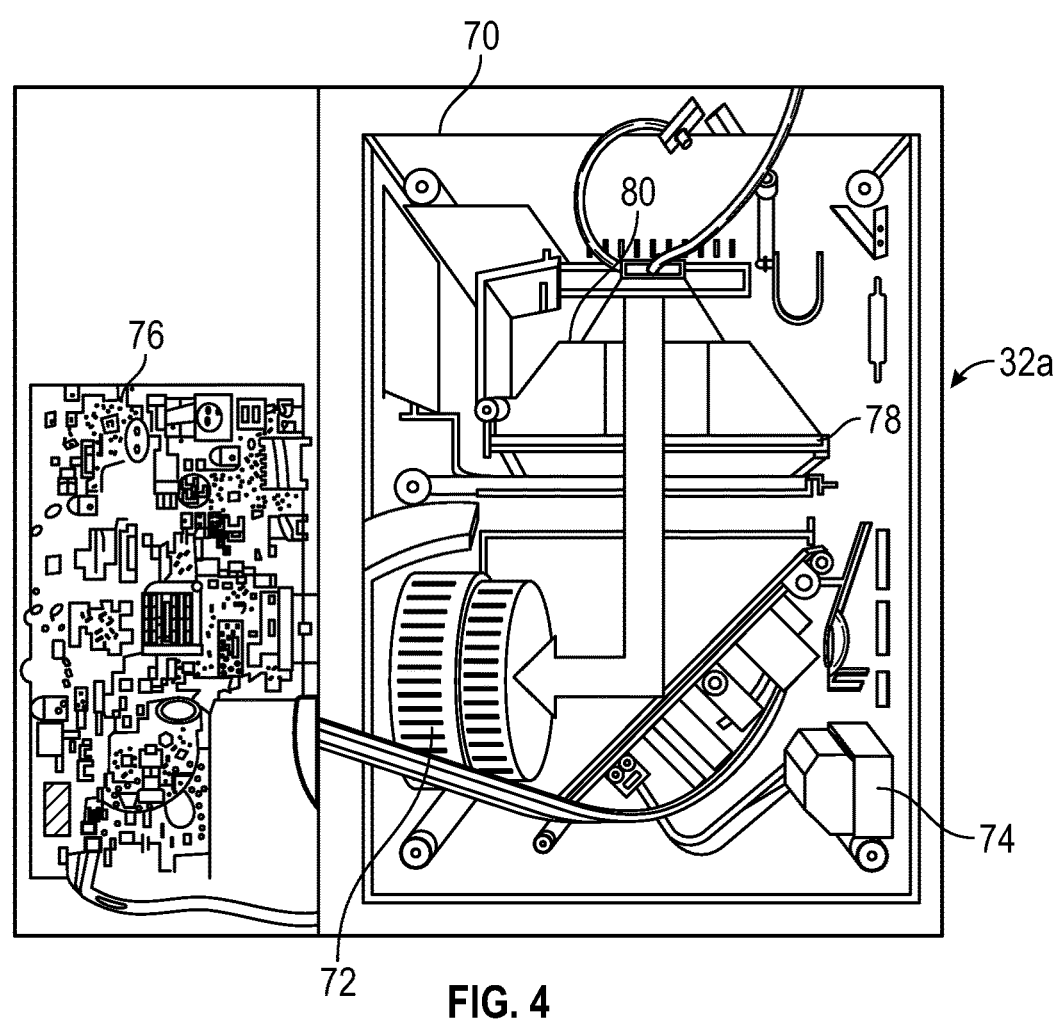
FIG. 4 is an exemplary view of an infrared projector in accordance with an embodiment of the present disclosure.

FIG. 4 illustrates an exemplary, cross-sectional view of an infrared (IR) projector 32a in accordance with the present disclosure. The IR projector 32a has a main body 70, a projection lens 72, a power supply 74, a controller 76, a modulator 78, and an infrared light source 80. The projection lens 72, the power supply 74, the controller 76, the modulator 78, and the infrared light source 80 are contained within and supported by the main body 70 of the IR projector 32a. The power supply 74 supplies power to the controller 76, the modulator 78 and the infrared light source 80. In some embodiments, the power supply 74 can be a battery, a solar cell, or a circuit that converts alternating current to direct current. For example, the circuit can be a switching power supply circuit. The infrared light source 80 generates infrared light that is directed to the modulator 78. The controller 76 receives an image, and provides image information to the modulator 78 so as to encode the image into the infrared light passing through the modulator 78 so as to generate encoded infrared light indicative of the image. The encoded infrared light may be directed through free-space (e.g., air) in an expanding fan-like pattern to the display surface 14 of the projection screen 12 through the projection lens 72. The projection screen 12 may be positioned a predetermined distance from the projection lens 72 of the IR projector 32a. In some embodiments, the projection screen 12 may be separate from the projector 32a to provide flexibility in the placement of the projection screen 12 relative to the projector 32a. The projection lens 72 of the IR projector 32a projects the image containing optical display image information onto the display surface 14 of the projection screen 12. In one embodiment, the infrared projector 32a may be similar in construction and function as a visible light projector, with the exception that the infrared projector 32a has the infrared light source 80 rather than a white visible light source. Any type of projectors can be used, including but not limited to, a LCD projector, a DLP projector, a laser projector. In case of LCD projector, the LCD modulator 78 may need an infrared polarizer instead of a visible polarizer which is used for a typical (visible) LCD projector.

While conventional visible projection screens include a white screen and thus have a very poor contrast ratio, the projection screen 12 may be a black screen and thus expected to have very high contrast ratio, which is similar to current OLED TVs. The projection screen 12 may include a DC power supply (not shown) to provide the voltage to the first and second electrodes 42 and 44, as discussed above. Without infrared irradiation, the display surface 14 of the projection screen 12 remains black. When the optical display image information is illuminated onto the display surface 14 of the projection screen 12 by the infrared projector 32a, an individual pixel of the plurality of pixels 18 and/or the sub-pixels 18a, 18b, or 18c are caused to emit light thereby generating the visible light image on the display surface 14 of the projection screen 12.

The projection screen 12 may display the images continuously without any display image degradation. The framing speed of the projection screen 12 may depend on the IR projector 32a utilized within the projection screen 12. In one embodiment, the framing speed may be between 30-60 Hz.

Figure 5A:
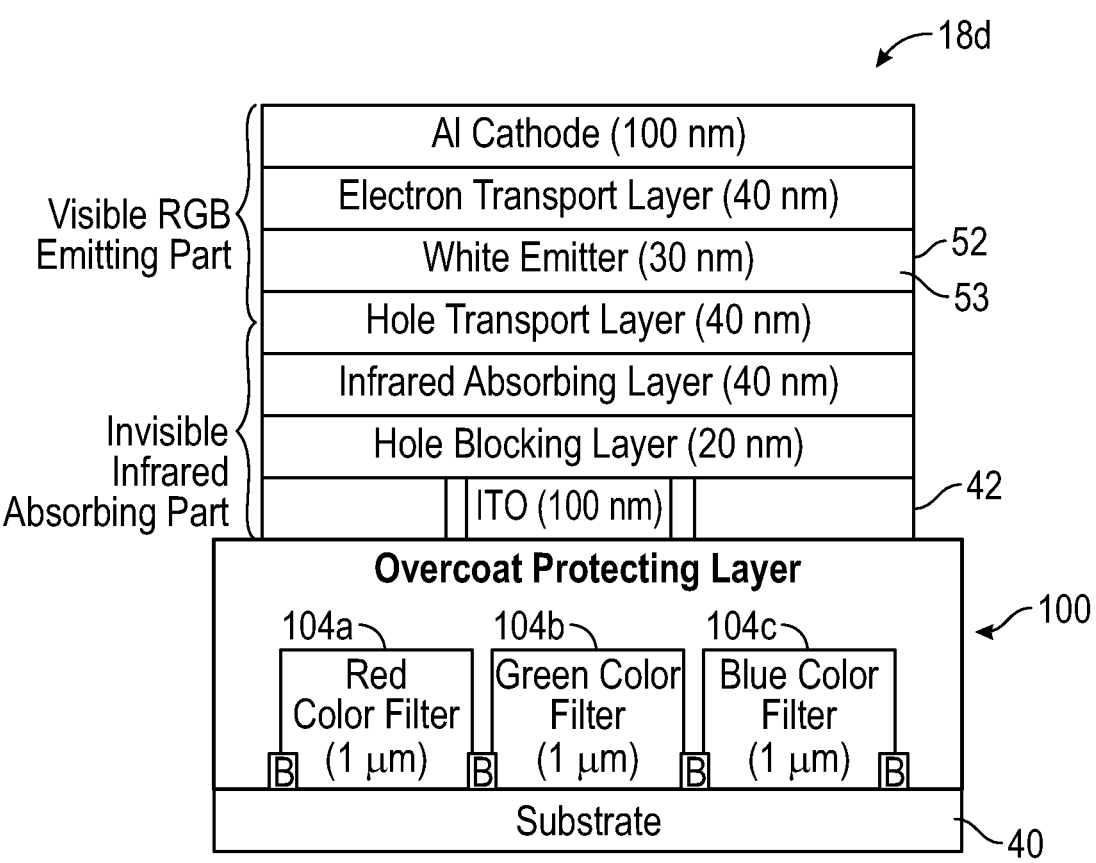
FIG. 5A-5C are exemplary single pixel structures in accordance with the present disclosure.
Figures 5B, 5C:
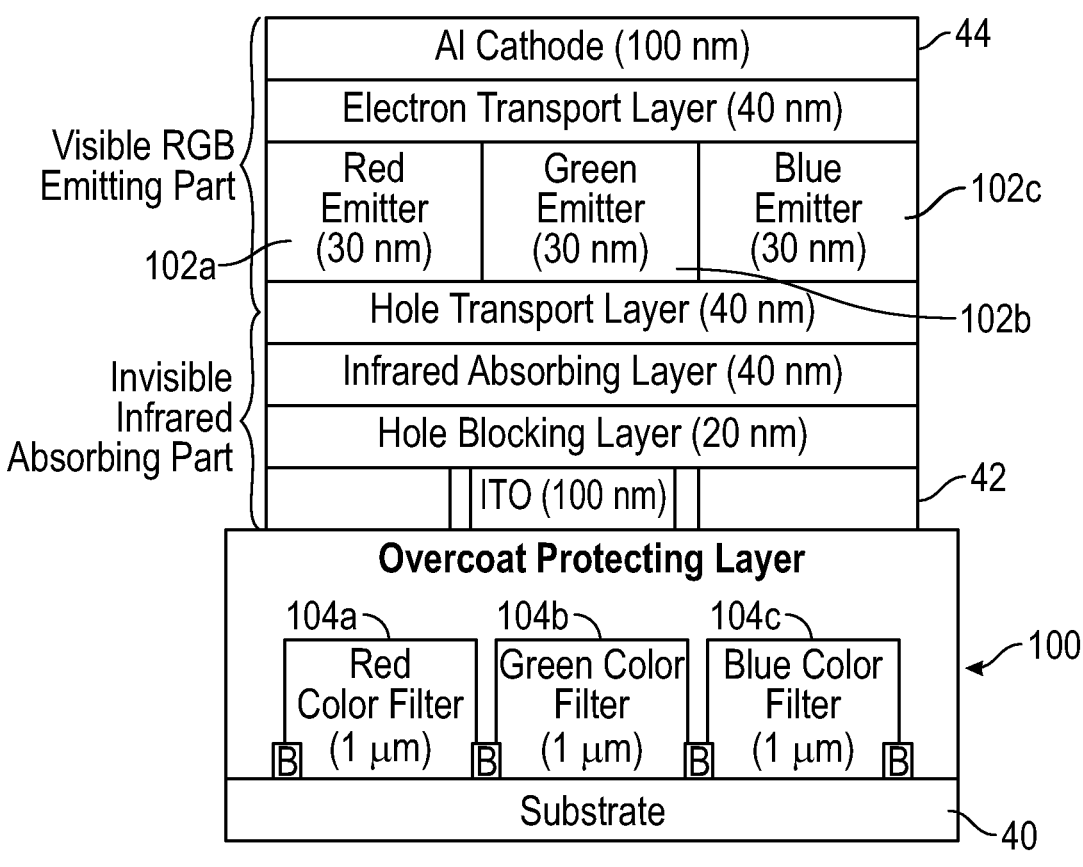

For a full-color display, each pixel of the plurality of pixels 18 has a sub-pixel array 100 corresponding to a particular color space. When RGB is the color space utilized by the projection screen 12, each pixel of the plurality of pixels 18 includes a red, green, and blue sub-pixel array 100. FIGS. 5A-5B illustrate various possible single pixel structures that include a red, green and blue sub-pixel array 100. The first electrode 42 can also be patterned to create red, green, and blue sub-pixels 18a, 18b, 18c via red, green and blue emitting layers 102a, 102b, and 102c as shown in FIGS. 5B and 5C.

FIG. 5A shows a pixel 18d having red, green, and blue color filters 104a, 104b, and 104c formed on the substrate 40. In this example, the visible emitting layer 52 is configured to generate white light via a white emitter 53. This is the simplest way to fabricate a full-color infrared-driven self-emitting projection screen 12 (e.g., based on OLED technology) because the white light generated by the white emitter 53 of the visible emitting layer 52 does not need to be patterned as a sub-pixel.

FIGS. 5B and 5C include the visible emitting layer 52 patterned to include red, green, and blue emitters 102a, 102b, and 102c. The performance of the projection screen 12 such as brightness, lifetime, and/or power consumption of a full-color infrared-sensitive self-emitting projection screen 12 based on OLED technology could be improved roughly by three times by minimizing emitted light loss due to the spectral mismatch between a white emitter 53 and red, green, blue color-filters 104a, 104b, and 104c. In order to fabricate the full-color infrared-driven self-emitting projection screen 12 (e.g., based on OLED technology), the red, green, and blue color filters 104a, 104b, and 104c should be located between the substrate 40 and the first electrode 42, such as an ITO anode, as shown in FIG. 5A-5B.

In one embodiment based on OLED technology, the final OLED resolution in this color filter location may be limited by a thickness of the substrate 40. In one embodiment, the thickness of the substrate 40 may be 0.7 mm, not allowing for a high-resolution projection screen 12 to be made. In another embodiment, a color filter 104*a*, 104*b*, 104*c* may be inserted between the substrate 40 and the first electrode 42 as shown in FIGS. 5A and 5B, limiting the final resolution of OLEDs by a thickness of the light source 28. The thickness of the light source 28 may be below 1 μm, allowing for a high-resolution projection screen 12. When the emission spectra of red, green, and blue emitters 102*a*, 102*b*, and 102*c* are narrower than the selection wavelength range of the color-filters 104*a*, 104*b* 104*c*, the color filters 104*a*, 104*b*, 104*c* are rarely required as shown in FIG. 5C.

Figure 6:
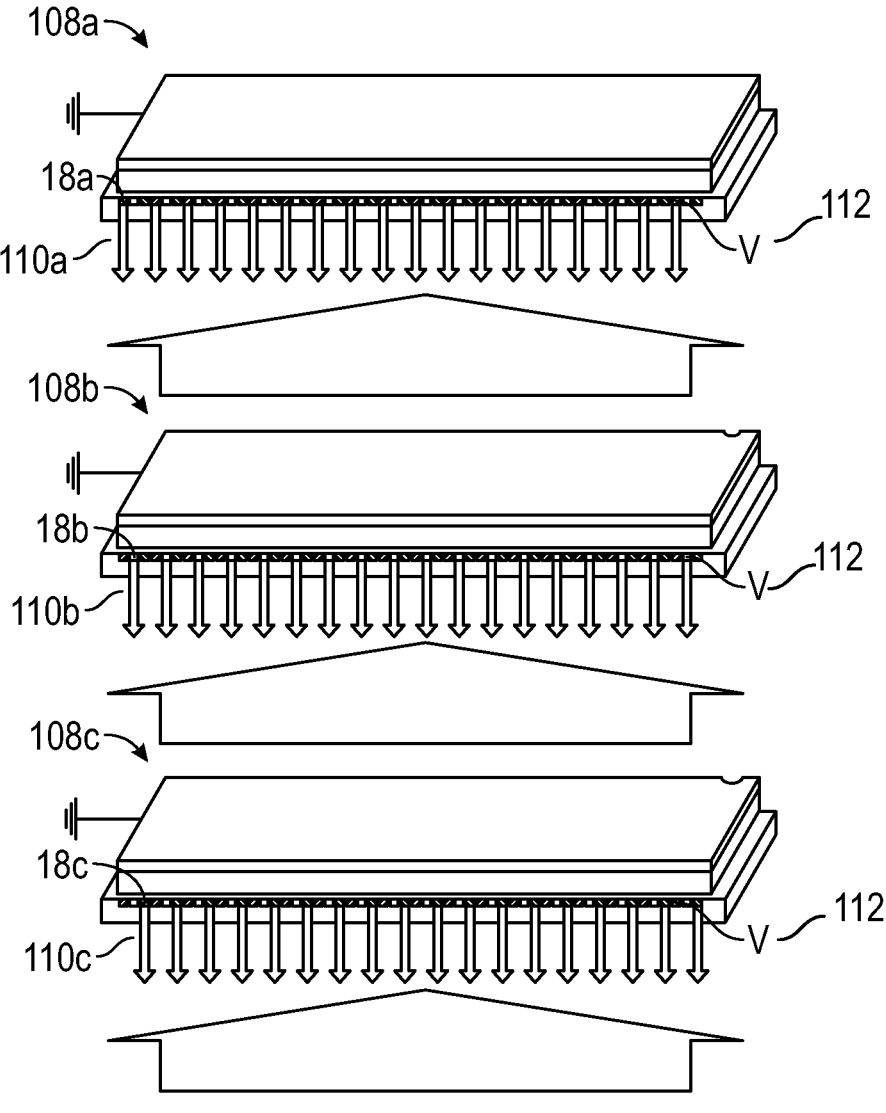
FIG. 6 is an exemplary method of using an embodiment of the display system in accordance with the present disclosure.

FIG. 6 illustrates an exemplary method of use of the display system 10. To generate a full-color operation of the projection screen 12, a sequential projection of infrared images containing red, green, and blue display image information 110*a*, 110*b*, and 110*c* are used. The infrared images are synced sequentially to red, green, and blue sub-pixels 18*a*, 18*b*, and 18*c* by voltages 112 applied sequentially in the projection screen 12 as shown in FIG. 6. In red sub-frame 108*a*, infrared projection images containing red display image information 110*a* are projected on the projection screen 12 and at the same time, the voltages 112 are only applied to red sub-pixels 18*a* on the projection screen 12. In green sub-frame 108*b*, infrared projection images containing green display image information 110*b* are projected on the projection screen 12 and at the same time, the voltages 112 are only applied to green sub-pixels 18*b* on the projection screen. In blue sub-frame 108*c*, infrared projection images containing blue display image information 110*c* are projected on the projection screen 12 and at the same time, the voltages 112 are only applied to blue sub-pixels 18*c* on the projection screen 12.

The following is a number list of non-limiting illustrative embodiments of the inventive concept disclosed herein:

1. A projection screen, comprising:
  a substrate supporting a plurality of pixels, each pixel of the plurality of pixels having a sensitizing part communicating with at least one light source, the sensitizing part being configured to detect a presence of a non-visible medium indicative of a part of an image, and to activate the at least one light source to emit light, the pixels having a first electrode and a second electrode configured to supply electricity to the sensitizing part and the light source.

2. The projection screen of illustrative embodiment 1, wherein the substrate is includes one or more of a glass, an organic polymer, a sapphire, a paper, a cloth, a fabric, or a foil.

3. The projection screen of any one of illustrative embodiments 1 or 2, wherein the sensitizing part includes a hole blocking layer, a non-visible sensing layer, and a hole transport layer, the non-visible sensing layer being located between the hole blocking layer and the hole transport layer.

4. The projection screen of illustrative embodiment 3, wherein the hole blocking layer is comprised of one or more of a ZnO, a TiO, a BCP, a Bphen, a 3TPYMB, a TPBi, a TMPYPB, a PC60BM, a PC70BM, and an ITIC.

5. The projection screen of any one of illustrative embodiments 3 or 4, wherein the non-visible sensing layer is configured to sense infrared light, and wherein the non-visible sensing layer includes one or more of a SnPc, a SnPc:C60, a SnNcCl2, a PbS nanocrystal layer, a PbSe nanocrystal layer, and an InAs nanocrystal layer.

6. The projection screen of any one of illustrative embodiments 3-5, wherein the hole transporting layer is comprised of one or more of a TAPC, a NPB, a TFB, a TPD, a poly-TPD, a TFB, and a P3HT.

7. The projection screen of any one of illustrative embodiments 1-6, wherein the first electrode is located between the sensitizing part and the substrate.

8. The projection screen of illustrative embodiment 7, wherein the first electrode is comprised of one or more of an ITO, an IZO, a CNT, a silver nanowire, PEDOT:PSS, Al, Ag, and Mg:Ag.

9. The projection screen of any one of illustrative embodiments 1-8 wherein the light source includes an organic light emitting diode including a visible emitting layer configured to emit visible light, the visible emitting layer comprised of an Ir(ppy)3, a FlrPic, Ir(MDQ)2(acac), a MEH-PPV, and an Alq3.

10. The projection screen of illustrative embodiment 9, wherein the organic light emitting diode includes an electron transport layer adjacent to the visible emitting layer, the electron transport layer is comprised of one or more of a BCP, a Bphen, a 3TPYMB, a TPBi, a TMPYPB, and an Alq3.

11. The projection screen of illustrative embodiment 10, wherein the organic light emitting diode includes an electron injection layer adjacent to the electron transport layer, the electron injection layer comprised of one or more of a LiF, and a Liq.

12. The projection screen of any one of illustrative embodiments 1-11, wherein the sensitizing part and the light source is positioned between the first electrode and the second electrode.

13. The projection screen of illustrative embodiment 12, wherein the second electrode is comprised of one or more of an ITO, an IZO, a CNT, a silver nanowire, PEDOT:PSS, Al, Ag, and Mg:Ag.

14. The projection screen of any one of illustrative embodiments 1-13, wherein the pixels include a red sub-pixel, a green sub-pixel, and a blue sub-pixel.

15. The projection screen of illustrative embodiment 14, wherein at least one of the first electrode and the second electrode is patterned to communicate individually with a red sub-pixel array including the red sub-pixel, a green sub-pixel array including the green sub-pixel, and a blue sub-pixel array including the blue sub-pixel.

16. The projection screen of any one of illustrative embodiments 1-15, wherein the substrate is devoid of a TFT backplane.

17. The projection screen of any one of illustrative embodiments 1-15, wherein the substrate is flexible so as to be capable of being rolled and unrolled without breaking.

18. The projection screen of illustrative embodiment 17, wherein the substrate is devoid of a TFT backplane.

19. The projection screen of any one of illustrative embodiments 1-15, wherein the substrate is rigid and incapable of being rolled and unrolled without breaking.

20. The projection screen of illustrative embodiment 19, wherein the substrate is devoid of a TFT backplane.

21. A method, comprising:
  projecting an invisible infrared image containing optical display image information through free space on a projection screen configured to convert the invisible infrared image into a visible image to cause the projection screen to emit visible light indicative of the invisible infrared image.

22. The method of illustrative embodiment 21, wherein the projection screen includes a substrate supporting a plurality of pixels, each pixel having a sensitizing part communicating with at least one organic light emitting diode, the sensitizing part being configured to detect a presence of a non-visible medium indicative of a part of an image, and to activate the at least one organic light emitting diode to emit light, the pixels having a first electrode and a second electrode configured to supply electricity to the sensitizing part and the at least one organic light emitting diode, and wherein simultaneously with projecting the invisible infrared image on the projection screen, the method further comprises applying a voltage to the first electrode and the second electrode to forward bias the at least one organic light emitting diode.

23. A method, comprising:

projecting a sequence of first, second and third non-visible medium images through free space on a projection screen configured to emit predetermined colors of visible light corresponding to requirements of a color space in the presence of the first, second, and third non-visible medium images, the first non-visible medium images containing display image information for a first color of the color space, the second non-visible medium images containing display image information for a second color of the color space, and the third non-visible medium images containing display information for a third color of the color space.

24. The method of illustrative embodiment 23, wherein the first color is red, the second color is green and the third color is blue, and wherein the color space is an RGB color space.

25. The method of illustrative embodiment 23, wherein the projection screen includes a plurality of pixels including a sub-array of organic light emitting diodes, and further comprising the step of applying a voltage potential to particular organic light emitting diodes within the sub-array of organic light emitting diodes simultaneously with the projection of the first, second and third non-visible medium images to cause the projection screen to emit a full-color image.

26. A display system, comprising:

a projection screen, comprising:

a substrate supporting a plurality of pixels, each pixel having a sensitizing part communicating with at least one organic light emitting diode, the sensitizing part being configured to detect a presence of a non-visible medium indicative of a part of an image, and to activate the at least one organic light emitting diode to emit light, the pixels having a first electrode and a second electrode supplying electricity to the sensitizing part and the organic light emitting diode; and a projector projecting an image through free space in a non-visible medium onto the substrate.

27. A projection screen, comprising:

a substrate supporting a plurality of pixels, each pixel having a sensitizing part communicating with at least one light source, the sensitizing part being configured to detect a presence of a non-visible medium indicative of a part of an image, and to activate the at least one light source to emit light, the pixels having a first electrode and a second electrode configured to supply electricity to the sensitizing part and the light source, the substrate being devoid of a TFT backplane.

While several embodiments of the inventive concepts have been described for purposes of this disclosure, it will be understood that numerous changes may be made which will readily suggest themselves to those skilled in the art and which are accomplished within the spirit of the inventive concepts disclosed and as defined in the appended claims.

What is claimed is:

1. A projection screen, comprising:

a substrate supporting a plurality of pixels, each pixel of the plurality of pixels having a sensitizing part communicating with at least one light source, the sensitizing part being configured to detect a presence of a non-visible medium indicative of a part of an image, and to activate the at least one light source to emit light, the pixels having a first electrode and a second electrode configured to supply electricity to the sensitizing part and the light source.

2. The projection screen of claim 1, wherein the substrate includes one or more of a glass, an organic polymer, a sapphire, a paper, a cloth, a fabric, or a foil.

3. The projection screen of claim 1, wherein the sensitizing part includes a hole blocking layer, a non-visible sensing layer, and a hole transport layer, the non-visible sensing layer being located between the hole blocking layer and the hole transport layer.

4. The projection screen of claim 3, wherein the hole blocking layer is comprised of one or more of a ZnO, a TiO, a BCP, a Bphen, a 3TPYMB, a TPBi, a TMPYPB, a PC60BM, a PC70BM, and an ITIC.

5. The projection screen of claim 3, wherein the non-visible sensing layer is configured to sense infrared light, and wherein the non-visible sensing layer includes one or more of a SnPc, a SnPc:C60, a SnNcCl2, a PbS nanocrystal layer, a PbSe nanocrystal layer, and an InAs nanocrystal layer.

6. The projection screen of claim 3, wherein the hole transporting layer is comprised of one or more of a TAPC, a NPB, a TFB, a TPD, a poly-TPD, a TFB, and a P3HT.

7. The projection screen of claim 1, wherein the first electrode is located between the sensitizing part and the substrate.

8. The projection screen of claim 7, wherein the first electrode is comprised of one or more of an ITO, an IZO, a CNT, a silver nanowire, PEDOT:PSS, Al, Ag, and Mg:Ag.

9. The projection screen of claim 1 wherein the light source includes an organic light emitting diode including a visible emitting layer configured to emit visible light, the visible emitting layer comprised of an Ir(ppy)3, a FIrPic, Ir(MDQ)2(acac), a MEH-PPV, and an Alq3.

10. The projection screen of claim 9, wherein the organic light emitting diode includes an electron transport layer adjacent to the visible emitting layer, the electron transport layer is comprised of one or more of a BCP, a Bphen, a 3TPYMB, a TPBi, a TMPYPB, and an Alq3.

11. The projection screen of claim 10, wherein the organic light emitting diode includes an electron injection layer adjacent to the electron transport layer, the electron injection layer comprised of one or more of a LiF, and a Liq.

12. The projection screen of claim 1, wherein the sensitizing part and the light source is positioned between the first electrode and the second electrode.

13. The projection screen of claim 12, wherein the second electrode is comprised of one or more of an ITO, an IZO, a CNT, a silver nanowire, PEDOT:PSS, Al, Ag, and Mg:Ag.

14. The projection screen of claim 1, wherein the pixels include a red sub-pixel, a green sub-pixel, and a blue sub-pixel.

15. The projection screen of claim 14, wherein at least one of the first electrode and the second electrode is patterned to communicate individually with a red sub-pixel array including the red sub-pixel, a green sub-pixel array including the green sub-pixel, and a blue sub-pixel array including the blue sub-pixel.

16. The projection screen of claim 1, wherein the substrate is devoid of a TFT backplane.

17. The projection screen of claim 1, wherein the substrate is flexible so as to be capable of being rolled and unrolled without breaking.

18. The projection screen of claim 17, wherein the substrate is devoid of a TFT backplane.

19. The projection screen of claim 1, wherein the substrate is rigid and incapable of being rolled and unrolled without breaking.

20. The projection screen of claim 19, wherein the substrate is devoid of a TFT backplane.

\* \* \* \* \*